United States Patent
Shao et al.

(10) Patent No.: US 8,618,827 B2
(45) Date of Patent: Dec. 31, 2013

(54) MEASUREMENT OF ELECTRICAL AND MECHANICAL CHARACTERISTICS OF LOW-K DIELECTRIC IN A SEMICONDUCTOR DEVICE

(75) Inventors: Tung-Liang Shao, Hsinchu (TW); Shih-Wei Liang, Taichung County (TW); Ying-Ju Chen, Tuku Township, Yunlin County (TW); Ching-Jung Yang, Pingzhen (TW); Hsien-Wei Chen, Sinying (TW); Hao-Yi Tsai, Hsinchu (TW); Mirng-Ji Lii, Sinpu Township, Hsinchu County (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 408 days.

(21) Appl. No.: 12/903,984

(22) Filed: Oct. 13, 2010

(65) Prior Publication Data

US 2012/0092033 A1    Apr. 19, 2012

(51) Int. Cl.
*G01R 31/02* (2006.01)
*G01R 31/26* (2006.01)

(52) U.S. Cl.
USPC .............. 324/762.05; 324/762.01; 324/71.5; 324/750.3; 438/18

(58) Field of Classification Search
USPC ........ 324/71.1, 71.5, 750.01, 754.01–754.31, 324/762.01, 762.05; 438/13, 17, 18, 14
See application file for complete search history.

(56) References Cited

U.S. PATENT DOCUMENTS

| | | | | |
|---|---|---|---|---|
| 5,448,179 A | * | 9/1995 | Burns | 438/17 |
| 6,787,803 B1 | * | 9/2004 | Yao et al. | 257/48 |
| 6,895,346 B2 | * | 5/2005 | Hamamura et al. | 702/58 |
| 7,250,311 B2 | * | 7/2007 | Aoki et al. | 438/14 |
| 7,319,043 B2 | * | 1/2008 | Yang et al. | 438/17 |
| 7,471,094 B2 | * | 12/2008 | Hobbs et al. | 324/750.22 |
| 7,509,875 B2 | * | 3/2009 | Knechtel | 73/827 |
| 7,576,357 B1 | * | 8/2009 | Zhu et al. | 257/48 |
| 7,622,309 B2 | * | 11/2009 | Su et al. | 438/14 |
| 7,716,992 B2 | * | 5/2010 | Maloney et al. | 73/777 |

(Continued)

FOREIGN PATENT DOCUMENTS

| | | | | |
|---|---|---|---|---|
| JP | 11198034 A | * | 7/1999 | B24B 49/10 |
| JP | 2006346821 A | * | 12/2006 | B24B 37/00 |

OTHER PUBLICATIONS

May, Gary S.; Spanos, Costas J.; Fundamentals of Semiconductor Manufacturing and Process Control; 2006; Wiley—IEEE Press; pp. 100-105.*

Buchanan, K.; The Evolution of Interconnect Technology for Silicon Integrated Circuitry; 2002; International Conference on Compound Semiconductor Manufacturing Technology; GaAs ManTech.*

(Continued)

*Primary Examiner* — Jermele M Hollington
*Assistant Examiner* — James Split
(74) *Attorney, Agent, or Firm* — Haynes and Boone, LLP

(57) ABSTRACT

Provided is a test structure for testing an unpackaged semiconductor wafer. The test structure includes a force-application component that is coupled to an interconnect structure of the semiconductor wafer. The force-application component is operable to exert a force to the semiconductor wafer. The test structure also includes first and second test portions that are coupled to the interconnect structure. The first and second test portions are operable to measure an electrical performance associated with a predetermined region of the interconnect structure. The first and second test portions are operable to measure the electrical performance while the force is exerted to the semiconductor wafer.

20 Claims, 7 Drawing Sheets

(56) References Cited

U.S. PATENT DOCUMENTS

| | | | |
|---|---|---|---|
| 7,748,278 B2* | 7/2010 | Sykes | 73/827 |
| 2005/0194649 A1* | 9/2005 | Oki | 257/409 |
| 2011/0221460 A1* | 9/2011 | Trebo et al. | 324/750.3 |
| 2011/0248739 A1* | 10/2011 | Kim et al. | 324/762.01 |

OTHER PUBLICATIONS

Endut, Z.; Ahmad, I.; Swee, G.L.H.; Sukemi, N.M.; Impact of Low-k Devices on Failure Mode of Flip Chip Tensile Pull Test; Dec. 2006; International Conference on Electronic Materials and Packaging; IEEE.*

* cited by examiner

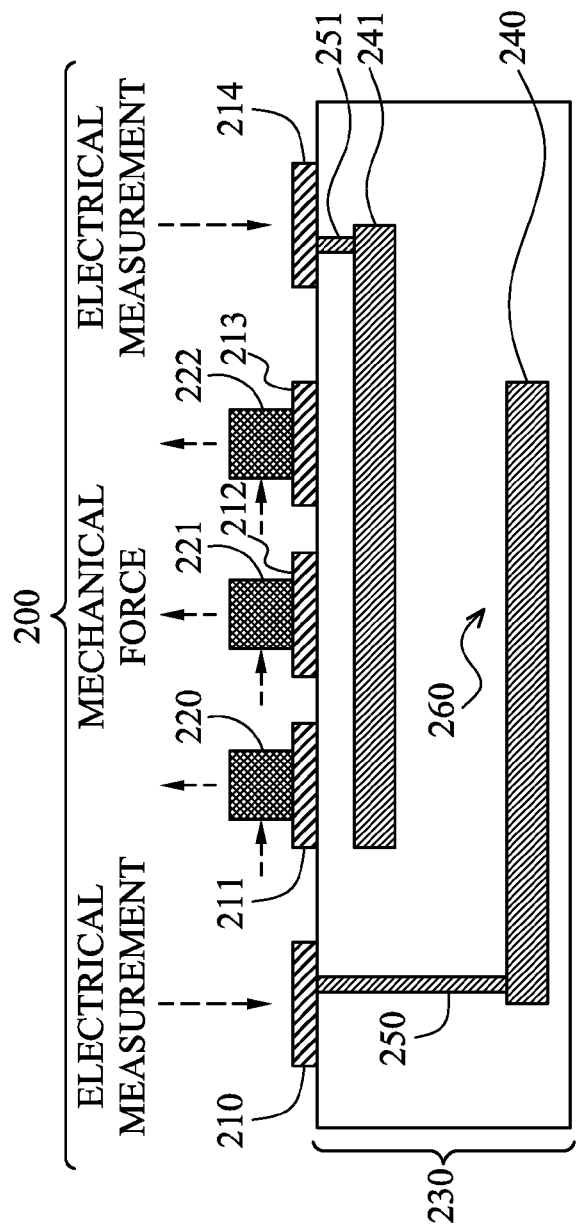
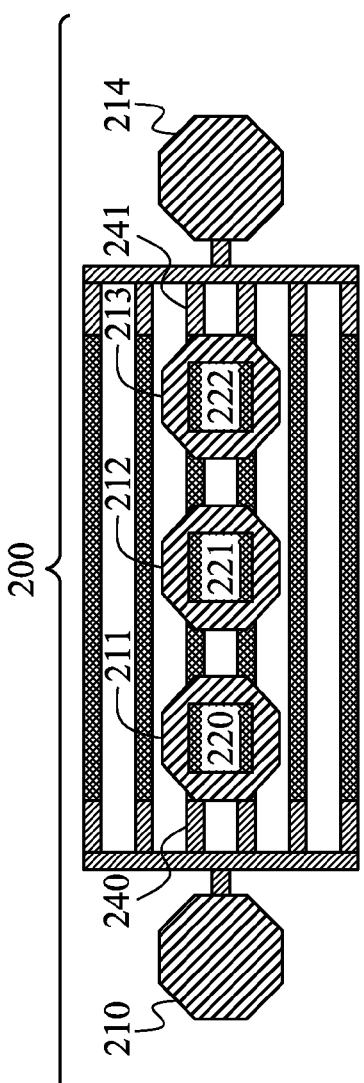

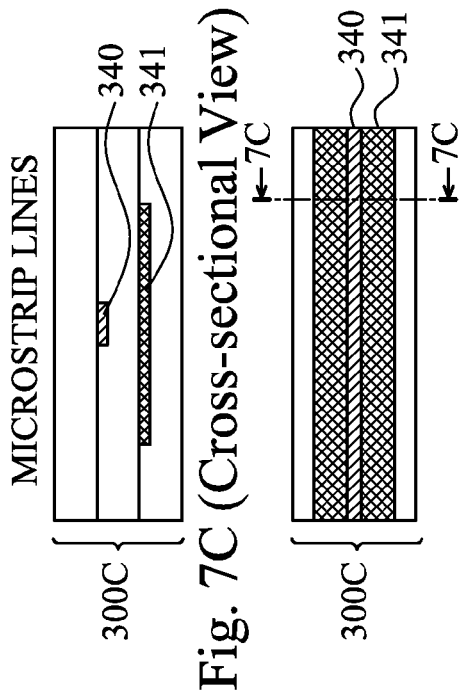
Fig. 7C (Cross-sectional View)
Fig. 7G (Top Level View)
MICROSTRIP LINES
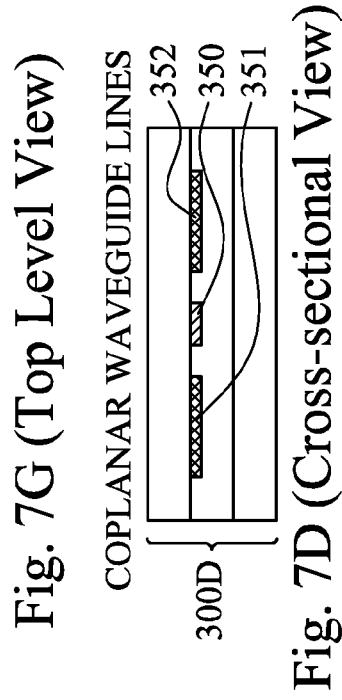
Fig. 7D (Cross-sectional View)
Fig. 7H (Top Level View)
COPLANAR WAVEGUIDE LINES
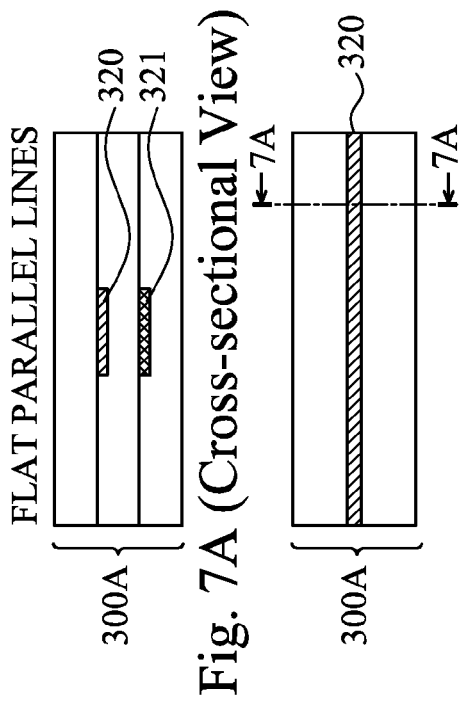
Fig. 7A (Cross-sectional View)
Fig. 7E (Top Level View)
FLAT PARALLEL LINES
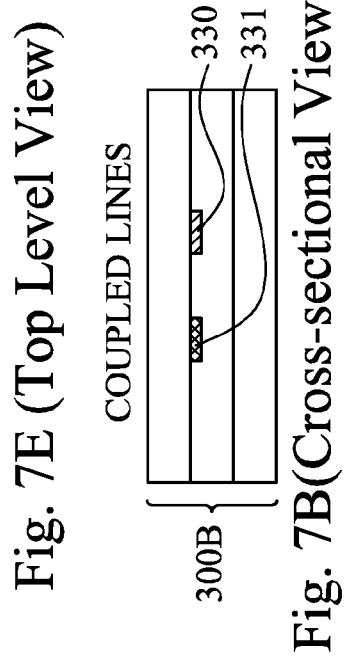
Fig. 7B (Cross-sectional View)
Fig. 7F (Top Level View)
COUPLED LINES

MEASUREMENT OF ELECTRICAL AND MECHANICAL CHARACTERISTICS OF LOW-K DIELECTRIC IN A SEMICONDUCTOR DEVICE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As semiconductor device sizes continue to shrink, it has become increasingly more difficult to make accurate measurements of various parts of a semiconductor device. For example, it may be desirable to measure mechanical and/or electrical characteristics of a low-k dielectric material of an IC to ascertain when and where potential cracking might occur within the IC. However, due to the shrinking sizes of the ICs and the components therein, existing mechanical and electrical measurements of the low-k dielectric materials are performed after the IC has been packaged. This requires longer verification time and additional resources, which may increase fabrication costs.

Therefore, while existing methods of measuring low-k dielectric materials in an IC have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 6A and 6B are a diagrammatic fragmentary cross-sectional side view and a diagrammatic top level view, respectively, of a test structure that can carry out the method of FIG. 1 according to another embodiment.

FIGS. 7A-7H are diagrammatic fragmentary cross-sectional side views and diagrammatic top level views of various types of transmission lines that may be used to carry out the method of FIG. 1.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
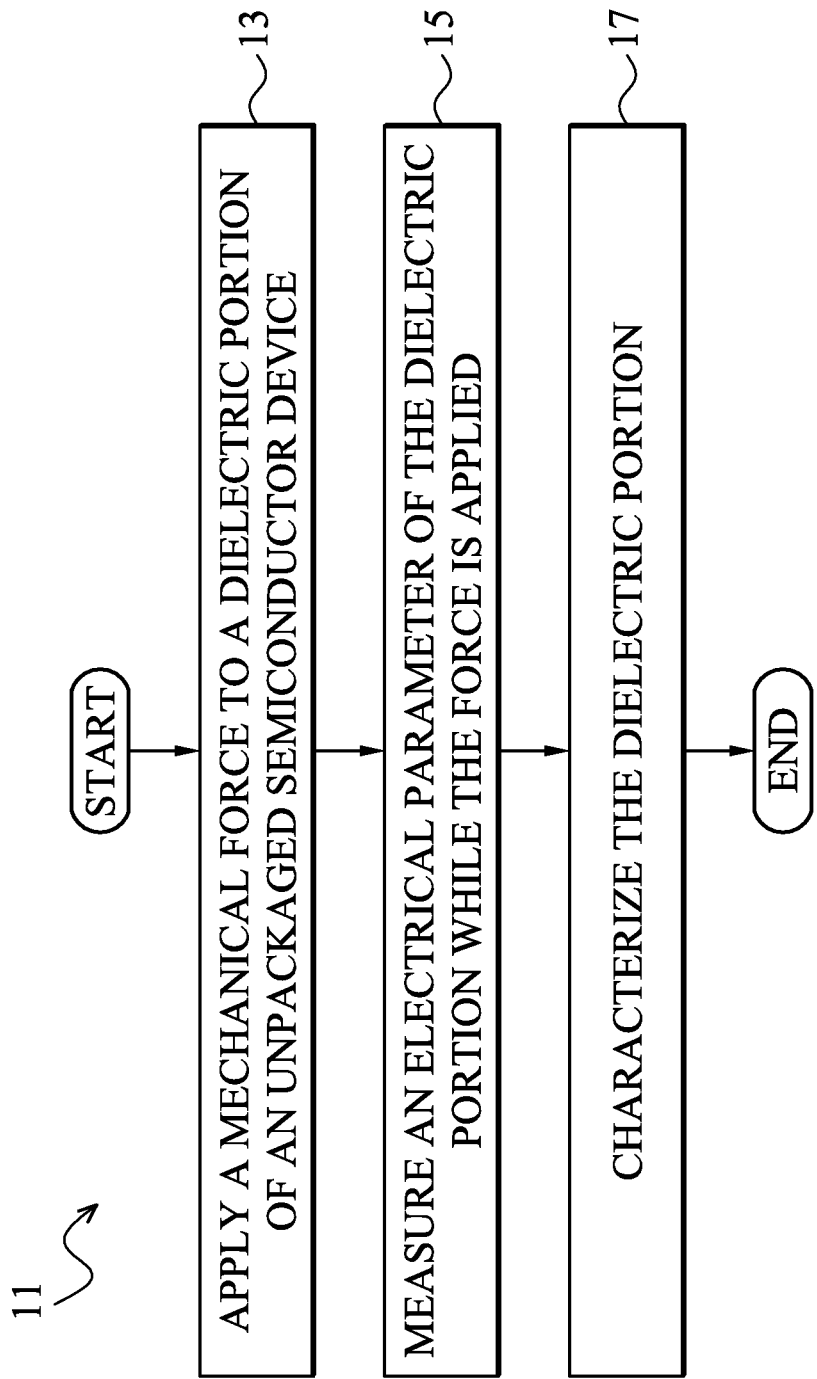
FIG. 1 is a flowchart illustrating a method of making measurements of a semiconductor device according to various aspects of the present disclosure.

Illustrated in FIG. 1 is a flowchart of a method 11 for testing a semiconductor device according to various aspects of the present disclosure. Referring to FIG. 1, the method 11 begins with block 13 in which a mechanical force is applied to a dielectric portion of an unpackaged semiconductor device. The method 11 continues with block 15 in which an electrical parameter of the dielectric portion is measured while the force is applied. The method 11 continues with block 17 in which the dielectric portion is characterized based on the measurement results.

Figure 2:
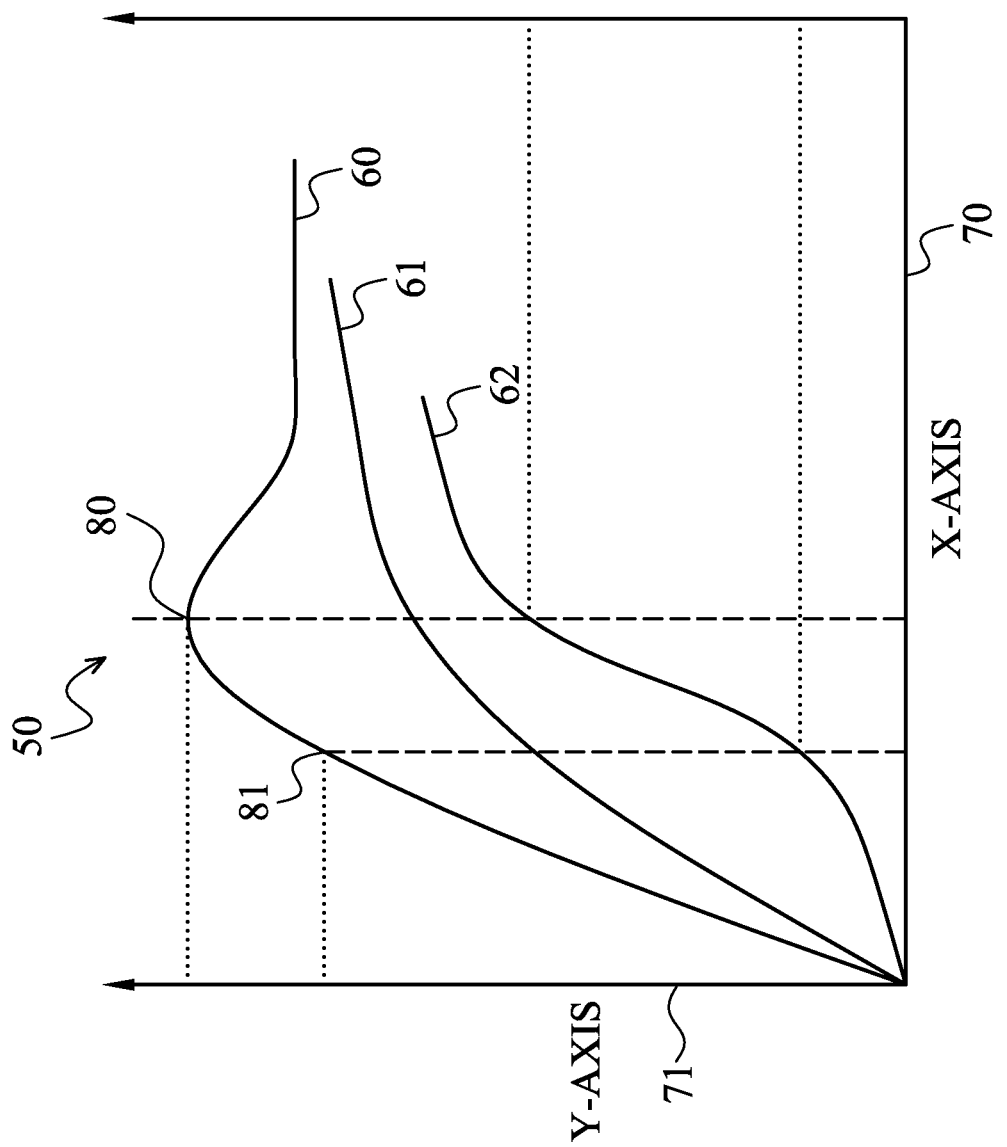
FIG. 2 is a chart that helps illustrate a method of measuring electrical and mechanical characteristics of a dielectric material within a semiconductor device according to an embodiment.

FIG. 2 is a graphical chart 50 that helps illustrate a method of measuring the electrical and mechanical characteristics of a dielectric material (for example, a low-k dielectric material) in a semiconductor device according to an embodiment of the method 11 of FIG. 1. The chart 50 has three curves 60, 61, and 62 that each represent a different set of measurement data of the dielectric material in the semiconductor device. Each of the curves 60-62 is plotted with respect to a horizontal X-axis 70 and a vertical Y-axis 71. The X-axis 70 represents an amount of time elapsed since the measurement began. The Y-axis 71 represents a different parameter for each of the curves 60-62. In particular, the Y-axis 71 represents an amount of pulling force applied to the semiconductor device for the curve 60, and represents a degree of deformation of the semiconductor device for the curve 61, and represents performance of electrical parameters (or characteristics) of the semiconductor device for the curve 62.

In more detail, when a mechanical force is applied to the semiconductor device (such as a test wafer), one or more electrical parameters of the semiconductor device is measured simultaneously. In an embodiment, a mechanical pulling force that increases with time may be applied to create stress within the semiconductor device, so as to induce cracking (micro-cracking, or cracks). This increasing mechanical pulling force is illustrated by the curve 60. At the same time, electrical measurements may be performed on the same semiconductor device while it is being pulled apart. These electrical measurements may include measurements of electrical parameters such as capacitance, resistance, leakage current, and flicker noise. The performance of one or more of these electrical parameters is illustrated by the curve 62.

As is illustrated in FIG. 2, when the pulling force (illustrated by the curve 60) gradually increases, the semiconductor device becomes more and more deformed (illustrated by the curve 61), and the electrical parameters (illustrated by the curve 62) may vary gradually as well. In an embodiment, one of the purposes of performing such measurements is to determine when potential cracking would occur within the semiconductor device. For example, it may be desirable to ascertain how much pulling force would result in potential cracking.

However, the degree of deformation typically does not exhibit a sharp or noticeable change as soon as cracking occurs, as evidenced by the relatively smooth curve 61. The curve 60 may exhibit a relatively sharp change at a point in time 80, but this sharp change usually occurs well after cracking first occurred, which may actually occur at an earlier point in time 81. Stated differently, the cracking within the semiconductor device that occurred at the earlier point in time 81 causes weakening of the structural integrity of the semiconductor device. As the pulling force continues to increase as time continues to pass, the weakening of the structural integrity becomes more and more severe, until the point in time 80 at which delamination occurs within the semiconductor device. The delamination makes it easier to pull apart the semiconductor device. Hence, the curve 60 actually decreases past the point in time 80.

From the above discussions, it can be seen that neither the pulling force (curve 60) nor the degree of deformation (curve 61) can be relied upon to ascertain exactly when the cracking first occurred. To solve this problem, the present embodiment uses electrical parameters to determine the initial occurrence of cracking. As shown in FIG. 2, the curve 62 undergoes a noticeable or sudden change at the point in time 81, corresponding to the initial occurrence of cracking. This is partly due to the fact that, as soon as cracking first occurs within the semiconductor device, the electrical parameters may experience sudden changes. For example, the cracking may lead to a sudden increase of leakage current. Thus, measurements of the electrical parameters (curve 62) may be used to promptly determine when cracking first occurred. Also, the amount of pulling force (curve 60) at the point in time 81 (when cracking first occurred) is also recorded. This amount of pulling force is then deemed to be the amount of pulling force that would cause cracking to appear within the semiconductor device.

Figure 3:
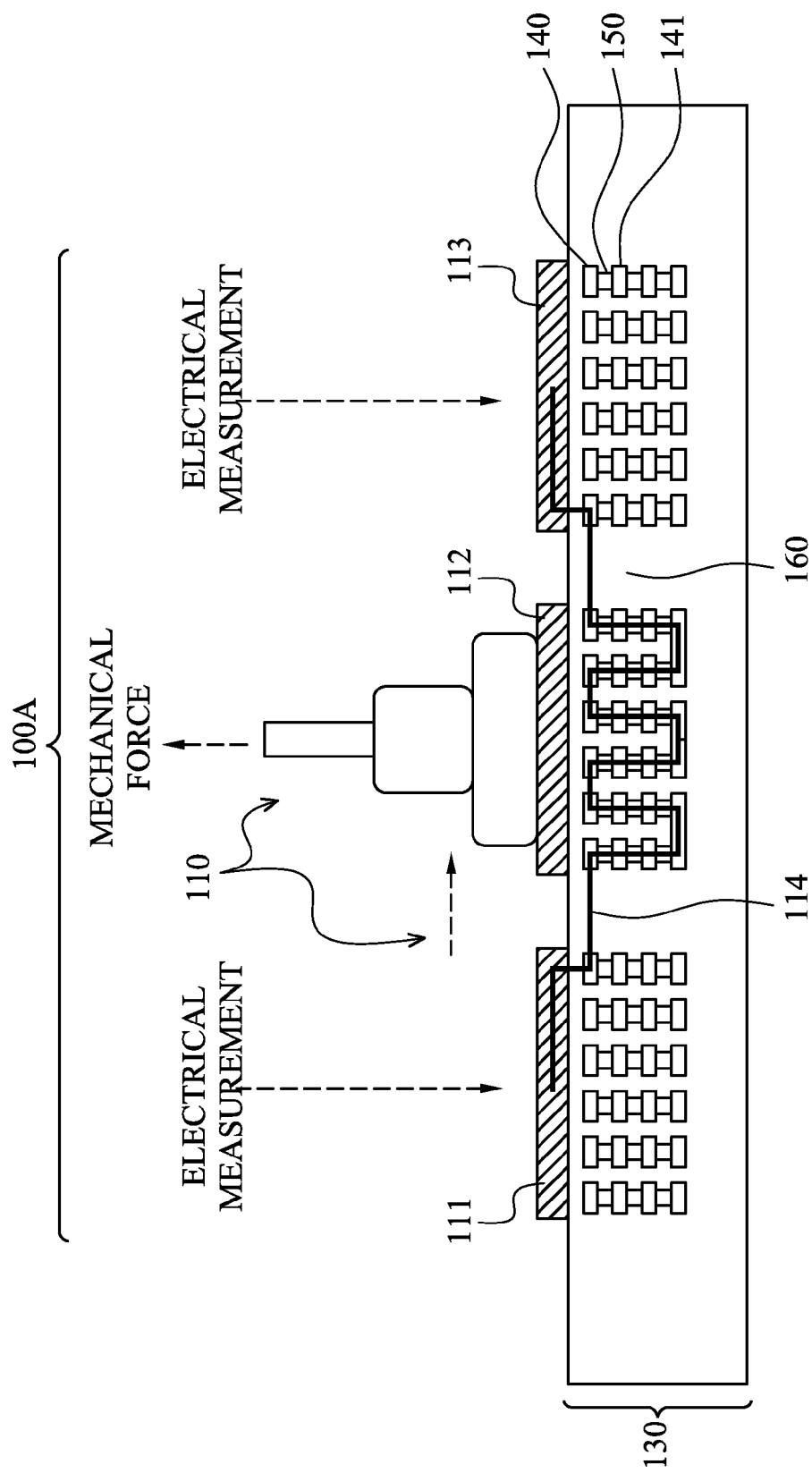
FIGS. 3-5 are diagrammatic fragmentary cross-sectional side views of various test structures that can carry out the method of FIG. 1 according to various embodiments.

FIG. 3 is a simplified diagrammatic fragmentary cross-sectional side view of a portion of a test structure 100A according to one embodiment. The test structure 100A may be used to measure electrical characteristics of a semiconductor device in real time as a mechanical force is applied to the semiconductor device. The test structure 100A includes a force-application component 110, test pads 111-113, and test wiring 114 (or test wire). The force-application component 110 includes a bonding wire in an embodiment and may include a metal material, such as copper, aluminum, or gold. The force-application component 110 may also be coupled to an external device that applies a pulling force to the force-application component 110 to pull portions of the semiconductor device coupled therebelow. The semiconductor device may be a test wafer or a production wafer that is undergoing fabrication before packaging.

The test pads 111-113 may each include a conductive material, such as copper or aluminum. In an embodiment, the test pads 111-113 are bonding pads. In other embodiments, the test pads 111-113 may be probe card metal (PCM) pads or under-bump metal (UBM) pads. The test pad 112 is coupled to the force-application component 110. The test pads 111 and 113 may each be coupled to external instruments that may apply electrical signals to the test pads 111 and 113, such as a voltage or a current. The test pads 111-113 may have various shapes, such as approximately square shapes, approximately rectangular shapes, polygonal shapes, or approximately round shapes.

The external device(s) and instruments coupled to the force-application component 110 and the test pads 111 and 113 are not specifically illustrated for the sake of simplicity, but it is understood that they may also be considered to be parts of the test structure 100A.

The test pads 111-113 are all coupled to a portion of an interconnect structure 130 of the semiconductor device. The interconnect structure 130 may include a plurality of metal layers that each include a plurality of interconnect features, also referred to as metal lines. The metal lines from different metal layers are electrically coupled together by vias/contacts. For the sake of illustration, metal lines 140 and 141 are designated in FIG. 3. The metal lines 140-141 belong to different metal layers and thus are coupled together by a via/contact 150.

The interconnect structure 130 also includes a dielectric material 160 that isolates the various metal lines and vias/contacts. In an embodiment, the dielectric material 160 includes a low-k dielectric material. A low-k dielectric material is a material having a dielectric constant that is less than a dielectric constant of $SiO_2$, which is approximately 4. For example, the low-k dielectric material may include: fluorinated silica glass (FSG), carbon doped silicon oxide, BLACK DIAMOND® dielectric material (Applied Materials of Santa Clara, Calif.), Xerogel, Aerogel, amorphous fluorinated carbon, Parylene, BCB (bis-benzocyclobutenes), SILK® dielectric material (Dow Chemical, Midland, Mich.), polyimide, and/or other materials.

As illustrated in FIG. 3, the test wiring 114 runs through the test pads 111, 113, and through various metal layers in a specified or predetermined region of the interconnect structure 130. This specified or predetermined region is a region where the measurements of the low-k dielectric material 160 is desired. When electrical test signals (such as voltage) are applied to the test pads 111 and 113, an accurate measurement of resistance experienced by the test wiring 114 may be obtained. While the electrical test signals are applied, an increasing mechanical force is also applied to pull the force-application component 110 and the test pad 112 in a direction away from the interconnect structure 130. The mechanical force is also operable to shear the force-application component 110 in a direction parallel to the interconnect structure 130.

With reference to FIG. 2 and the associated discussions above, as the mechanical pulling force increases over time, micro cracks (or cracking) may begin to appear within the dielectric material 160 of the interconnect structure 130. When cracking occurs, the resistance (along the path of the test wiring 114) measured from the test pads 111 and 113 may change appropriately, which may be a noticeable sudden variation of the resistance value. This sudden change in resistance will be detected by the instruments coupled to the test pads 111 and 113, and the test structure 100A will recognize that cracking has occurred. The amount of the mechanical pulling force corresponding to the occurrence of the cracking will be recorded and deemed the amount of force it takes to cause cracking within the dielectric material. In this manner, the test structure 100A can determine the occurrence of cracking before the point of delamination is reached.

It is understood that the semiconductor device containing the interconnect structure 130 has not been packaged yet at this time. In other words, the testing of the semiconductor device is done at a wafer level. The interconnect structure 130 itself may not even be completely fabricated. In fact, the test pads 111-113 may be coupled to one of the intermediate metal layers of the interconnect structure 130 as the interconnect structure 130 is still undergoing fabrication. For example, the interconnect structure 130 may be designed to have ten metal layers. When the fabrication of fifth metal layer is completed, and before the sixth layer is fabricated, the test structure 100A may be coupled to measure the mechanical and electrical performance of the dielectric material 160 (to determine cracking). As another example, all ten metal layers of the interconnect structure 130 have been fabricated, but the semiconductor device has not been packaged. The test structure 100A may also be used at this stage to detect cracking.

Figure 4:
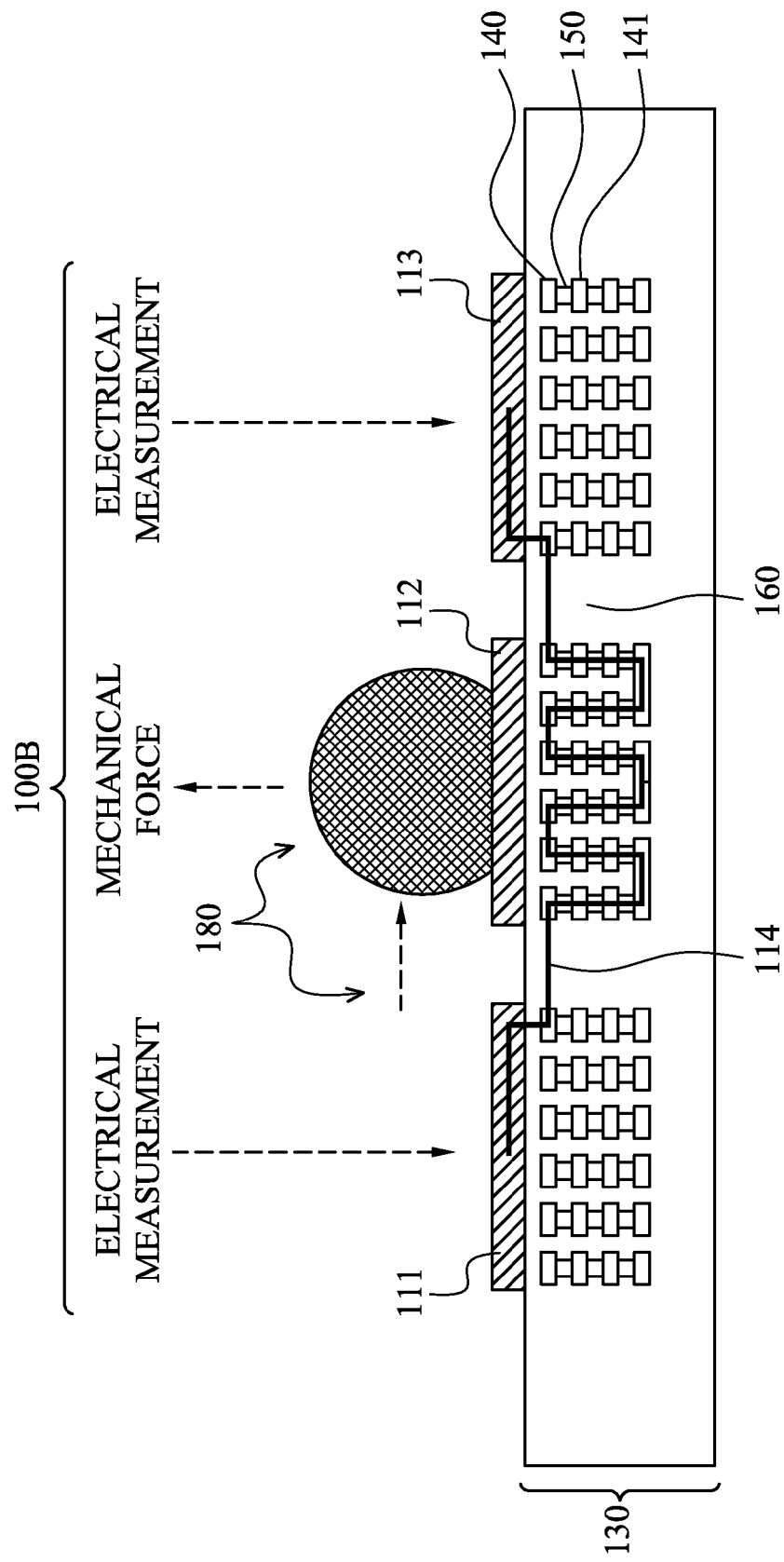

FIG. 4 is a simplified diagrammatic fragmentary cross-sectional side view of a portion of a test structure 100B according to an alternative embodiment. The test structure 100B is similar to the test structure 100A (illustrated in FIG. 3), and for the sake of consistency and clarity, similar features are labeled the same for both of the test structures 100A and 100B. One difference between the test structure 100A and the test structure 100B is that, the test structure 100B uses a solder ball as a force-application component 180, instead of a bonding wire. As such, the test structure 100B is compatible with flip-chip technologies. The test structure 100B functions in a similar manner as the test structure 100A to promptly detect cracking within the interconnect structure 130 before the semiconductor device is packaged.

Figure 5:
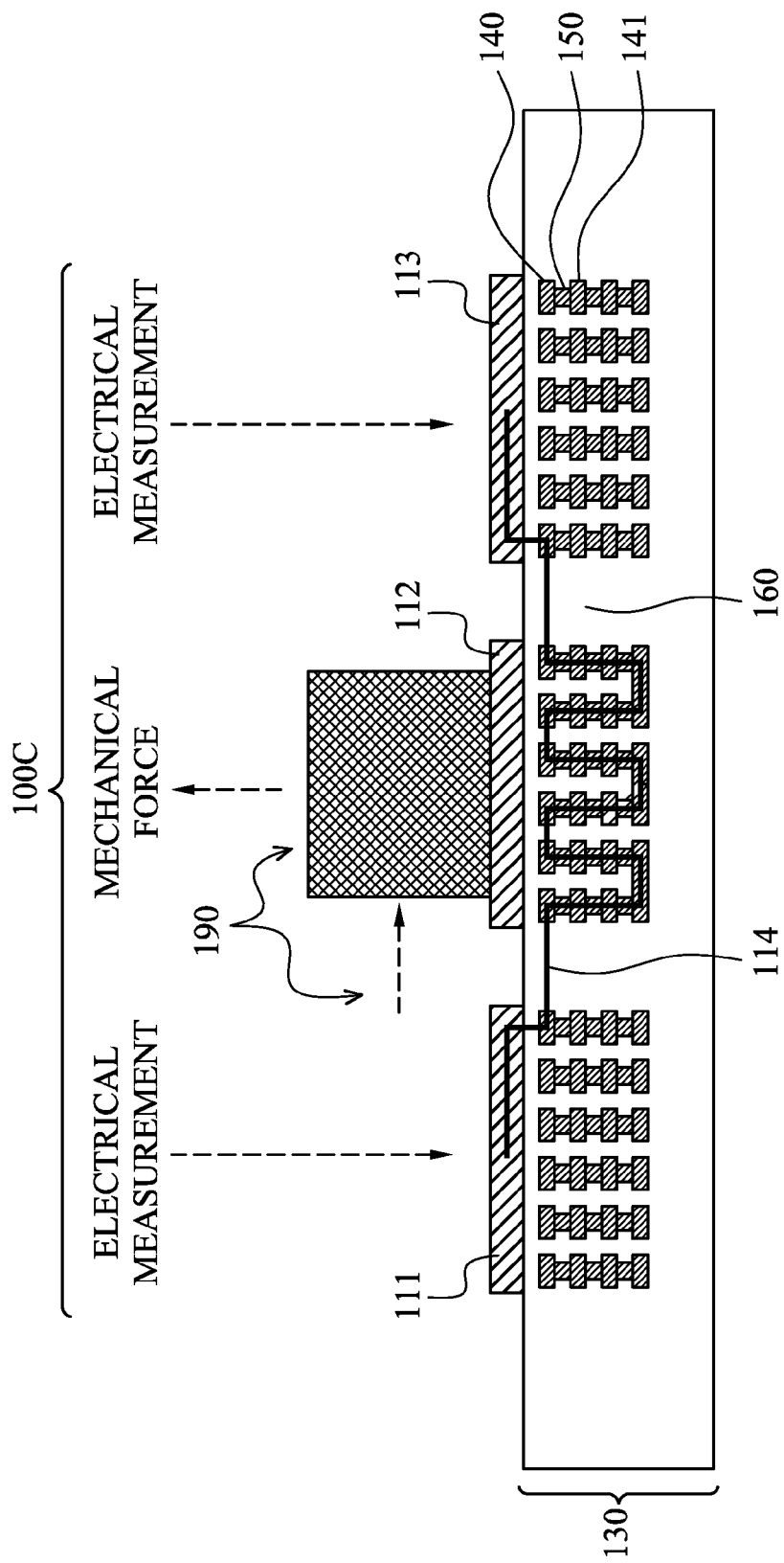

FIG. 5 is a simplified diagrammatic fragmentary cross-sectional side view of a portion of a test structure 100C according to another alternative embodiment. The test structure 100C is similar to the test structure 100A (illustrated in FIG. 3), and for the sake of consistency and clarity, similar features are labeled the same for both of the test structures 100A and 100C. One difference between the test structure 100A and the test structure 100C is that, the test structure 100C uses a copper bump as a force-application component 190, instead of a bonding wire. The test structure 100C functions in a similar manner as the test structure 100A to promptly detect cracking within the interconnect structure 130 before the semiconductor device is packaged.

FIG. 6A is a simplified diagrammatic fragmentary cross-sectional side view of a portion of a test structure 200 according to an embodiment, and FIG. 6B is a simplified diagrammatic fragmentary top level view of a portion of the test structure 200. The test structure 200 includes test pads 210-214 and force-application components 220-222. The test pads 210-214 are similar to the test pads 111-113 shown in FIGS. 3-5. The test structure 200 may also include external devices and instruments coupled to the force-application components 220-222 and the test pads 210-214, respectively. These devices/instruments are capable of applying a mechanical pulling force to the force-application components 220-222 and electrical test signals to the test pads 210 and 214. For the sake of simplicity, these devices/instruments are not specifically illustrated.

The force-application components 220-222 may be similar to the force-application components 110 (FIG. 3), 180 (FIG. 4), or 190 (FIG. 5). Thus, the force-application components 220-222 may each include a bonding wire, a solder ball, or a copper bump. The force-application components 220-222 are coupled to the test pads 211-213, respectively.

The test pads 210-214 are coupled to an interconnect structure 230 that may be similar to the interconnect structure 130 (FIGS. 3-5), in that the interconnect structure 230 also includes a plurality of metal layers containing metal lines that are coupled by vias/contacts and surrounded by a low-k dielectric material. As an example, two metal lines 240 and 241 from different metal layers (for example, a metal 1 layer and a metal 2 layer) are shown in FIGS. 6A-6B. The metal lines 240-241 may each include a plurality of branches, as seen from the top level view of FIG. 6B. In an embodiment, a ratio of a width of the branches and a spacing between the branches is about 2:5.

The metal lines 240-241 also partially overlap, and the partially overlapped regions are illustrated with a darker shading in the top level view 6B. In an embodiment, the test pads 220-222 are disposed over at least a portion of the overlapped regions. The metal line 240 is electrically coupled to the test pad 210 by a via/contact 250, and the metal line 241 is electrically coupled to the test pad 214 by a via/contact 251.

A low-k dielectric material 260 surrounds the metal lines 240-241 and the vias/contacts 250-251. The overlapped portions of the metal lines 240-241 and a portion of the low-k dielectric material 260 disposed therebetween in effect act as a capacitor, with the metal lines 240-241 serving as the two plates. The portion of the low-k dielectric material 260 of the capacitor may be considered to be located in a specified or predetermined region of the interconnect structure 230, where measurement of the low-k dielectric material is desired. During testing, an increasing mechanical force is applied to the force-application components 220-222 to pull them in a direction away from the interconnect structure 230, while electrical testing signals are applied to the test pads 210 and 214. As the mechanical pulling force becomes greater, cracking may begin to occur within this predetermined portion of the low-k dielectric material 260.

The cracking may change the dielectric constant of the low-k dielectric material 260 of the capacitor. For example, there may be an air-gap within the low-k dielectric material 260 due to the gap. Also, the cracking may cause deformation of the capacitor, thereby changing the distance between the two plates (metal lines 240-241) and/or the area of the capacitor. The change in the dielectric constant of the dielectric material and the distance/area of the capacitor will alter the effective capacitance of the capacitor. In addition, the cracking may also affect an amount of leakage current within or near the region of the capacitor. Similar to the embodiments described above with reference to FIGS. 3-5, the test structure 200 is capable of detecting such variations of capacitance and/or leakage current through the electrical signals sent to and received from the test pads 210 and 214. Based on the detection results, the test structure 200 may be able to accurately determine if and when the cracking occurred within the interconnect structure 230, and the amount of pulling force corresponding to the cracking.

It is understood that the test structure 200 carries out the mechanical and electrical testing and determines the occurrence of cracking before the semiconductor device is packaged. Thus, the testing is done at a wafer level. Also, although FIGS. 6A-6B illustrate only two metal lines 240-241 in two different metal layers, it is understood that in other embodiments other configurations may be utilized to implement the test structure. For example, an alternative test structure may involve multiple metal layers and multiple metal lines and vias/contacts, thus forming multiple effective capacitors. The capacitance and/or leakage current associated with each of these multiple capacitors may be measured by the alternative test structure, which may ascertain the occurrence of cracking within any one of these capacitors. Furthermore, an alternative test structure may use any number of test pads and force-application components that can be used to exert the pulling force.

In some embodiments, test structures similar to the test structures 100 and 200 discussed above with reference to FIGS. 3-6 may be implemented to carry out electrical testing that includes the measurement of one or more radio-frequency (RF) parameters, such as change in flicker noise. FIGS. 7A-7D are diagrammatic fragmentary cross-sectional side views of portions of interconnect structures 300A-300D, respectively. FIGS. 7E-7H are diagrammatic fragmentary top level views of portions of the interconnect structures 300A-300D, respectively. It is understood that the cross-sectional views 7A-7D are taken in a direction denoted by dashed arrows shown over the top level views 7E-7H, respectively.

Each of these interconnect structures include RF signal carriers, such as transmission lines. In more detail, FIGS. 7A and 7E illustrate a portion of the interconnect structure 300A having flat parallel lines that carry RF signals. A signal line 320 is disposed in one of the metal layers of the interconnect structure 300A, and a ground line 321 is disposed in another one of the metal layers of the interconnect structure. The signal line 320 and the ground line 321 run parallel to each other in the different metal layers. Since FIG. 7E is the top level view, the ground line 321 may not be observable in FIG. 7E. The flat parallel lines illustrated herein may have the following characteristic impedance:

$$Z_O = \frac{377}{\sqrt{\varepsilon r}} \text{Ln}\left[\frac{H}{W}\right]$$

FIGS. 7B and 7F illustrate a portion of the interconnect structure 300B having coupled lines that carry RF signals. A signal line 330 and a ground line 331 are disposed within a same one of the metal layers of the interconnect structure 300B. The coupled lines illustrated herein may have the following characteristic impedance:

$$Z_O = \frac{120}{\sqrt{\varepsilon r}} \text{Ln}\left[\frac{\pi A}{W+T}\right]$$

FIGS. 7C and 7G illustrate a portion of the interconnect structure 300C having microstrip lines that carry RF signals. A signal line 340 is disposed in one of the metal layers of the interconnect structure 300C, and a ground line 341 is disposed in another one of the metal layers of the interconnect structure. The microstrip lines illustrated herein may have the following characteristic impedance:

$$Z_O = \frac{87}{\sqrt{\varepsilon r + 1.41}} \text{Ln}\left(\frac{5.98 * H}{0.8W + T}\right)$$

FIGS. 7D and 7H illustrate a portion of the interconnect structure 300D having coplanar waveguide lines that carry RF signals. A signal line 350 and ground line 351-352 are disposed within a same one of the metal layers of the interconnect structure 300D.

These various types of transmission lines discussed above and illustrated in FIGS. 7A-7H may be implemented in various different parts of a semiconductor device, such as a semiconductor IC chip. In an embodiment, at or near the corner regions of the IC chip, test structures similar to those discussed above in association with FIGS. 3-6 may be implemented to exert a mechanical pulling force on the chip and simultaneously measure RF parameters of the IC chip through the transmission lines. For example, flicker noise may be measured as one of the RF parameters.

Similar to what was discussed above, when cracking begins to appear within the IC chip, flicker noise may also vary accordingly, which may be a sudden variation. In this manner, cracking may be ascertained for the IC chip by using the transmission lines. The transmission lines may also be used to measure DC continuity characteristics, which may also help ascertain the occurrence of cracking. It is also understood that the IC chip in which these transmission lines are implemented may not have been packaged yet when the testing takes place. For the sake of simplicity, these test structures are not illustrated in detail herein.

After the testing, additional processes may be performed to finish fabrication of the semiconductor device. For example, these additional processes may include passivation, dicing of the wafer, and packaging.

The various embodiments of the test structures disclosed herein offer several advantages. It is understood, however, that other embodiments may offer different advantages, and that no particular advantage is required for all embodiments. One of the advantages is that, as discussed above, the electrical parameters may be measured at the same time as when the pulling force is applied to induce cracking within the semiconductor device. Based on the measurement results, one may promptly determine when cracking occurred, as the electrical parameters may experience a sudden change when cracking occurs. In comparison, previous methods of ascertaining cracking may need to utilize a measurement of degree of deformation within a semiconductor device, which is unreliable and inefficient.

Another advantage is that the embodiments disclosed herein are capable of ascertaining the occurrence of cracking while the semiconductor wafer is still unpackaged. Hence, the test structure may be deployed at various stages of fabrication, and as such is capable of narrowing down the occurrence of cracking within a specified region, for example within a particular metal layer. In addition, the capability of ascertaining cracking before packaging will save fabrication resources.

One of the broader forms of the present disclosure involves a test structure for testing an unpackaged semiconductor wafer. The test structure includes: a force-application component coupled to an interconnect structure of the semiconductor wafer, the force-application component being operable to exert a force to the semiconductor wafer; and first and second test portions coupled to the interconnect structure, the first and second test portions being operable to measure an electrical performance associated with a predetermined region of the interconnect structure; wherein the first and second test portions are operable to measure the electrical performance while the force is exerted to the semiconductor wafer.

Another of the broader forms of the present disclosure involves an apparatus that includes a test structure. The test structure is operable to: apply a mechanical force that varies with time to a predetermined region of an unpackaged semiconductor device; measure a variation of an electrical parameter of the region in response to the mechanical force; and determine an occurrence of a defect within the region based on the variation.

Still another of the broader forms of the present disclosure involves a method of testing a semiconductor device. The method includes: applying a mechanical force to a dielectric portion of an unpackaged semiconductor device; measuring an electrical parameter of the dielectric portion while the force is applied; and characterizing the dielectric portion based on the measuring.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A test structure for testing an unpackaged semiconductor wafer, comprising:
   a force-application component coupled to an interconnect structure of the unpackaged semiconductor wafer, the force-application component being operable to exert a gradually-increasing force to the unpackaged semiconductor wafer to induce an incipient cracking or delamination defect within the interconnect structure of the unpackaged semiconductor wafer; and
   first and second test portions coupled to the interconnect structure, the first and second test portions being operable to measure an electrical performance associated with a predetermined region of the interconnect structure;
   wherein the first and second test portions are operable to measure a sudden variation in the electrical performance that corresponds to the inducement of the incipient cracking or delamination defect within the predetermined region of the interconnect structure of the unpackaged semiconductor wafer.

2. The test structure of claim 1, wherein:
   the force-application component is coupled to the interconnect structure through a test pad, the force-application component including one of: bonding wire, solder ball, or copper bump;
   the force-application component is operable to pull the test pad in a direction away from the interconnect structure; and
   the force-application component is operable to shear the test pad in a direction parallel to the interconnect structure.

3. The test structure of claim 1, wherein:
   the first and second test portions respectively include first and second test pads through which electrical signals can travel;
   the first and second test pads are coupled to a plurality of metal layers of the interconnect structure; and
   the electrical performance measured includes electrical characteristics associated with a low-k dielectric material in the predetermined region.

4. The test structure of claim 3, further including a test wire that runs through a subset of the plurality of metal layers within the predetermined region of the interconnect structure, the test wire having one end coupled to the first test pad and an opposite end coupled to the second test pad.

5. The test structure of claim 3, wherein the first test pad is electrically coupled to a first metal line of the interconnect structure, and the second test pad is electrically coupled to a second metal line of the interconnect structure, the first and second metal lines being disposed in different metal layers of the interconnect structure and partially overlapping with each other in the predetermined region.

6. The test structure of claim 3, wherein the force-application component is disposed over a portion of the predetermined region.

7. The test structure of claim 3, wherein the electrical characteristics are selected from the group consisting of: resistance, capacitance, leakage current, and flicker noise.

8. The test structure of claim 1, wherein the interconnect structure is a partially-fabricated interconnect structure.

9. An apparatus comprising a test structure that:
   applies a mechanical force that gradually increases with time to a specified region of an unpackaged semiconductor wafer, the mechanical force including a pulling force that pulls in a direction away from the unpackaged semiconductor wafer to induce an incipient cracking or delamination defect within the specified region;
   measures a sudden variation of an electrical parameter of the region in response to the mechanical force;
   determines an occurrence of the incipient cracking or delamination defect within the region based on the sudden variation of the electrical parameter; and
   records a value of the mechanical force that corresponds with the sudden variation.

10. The apparatus of claim 9, wherein the test structure is operable to:
    measure the variation simultaneously as the mechanical force is applied.

11. The apparatus of claim 9, wherein the electrical parameter is selected from the group consisting of: resistance, capacitance, leakage current, and flicker noise.

12. The apparatus of claim 9, wherein the specified region includes a low-k dielectric material that is a portion of an interconnect structure of the unpackaged semiconductor wafer.

13. The apparatus of claim 9, wherein the specified region includes a plurality of interconnect layers, and wherein the test structure further includes a test wiring that runs through the plurality of interconnect layers, wherein the plurality of interconnect layers belong to a partially-fabricated interconnect structure.

14. A method, comprising:
    applying a mechanical force to a plurality of internal layers of an unpackaged semiconductor wafer to induce an incipient cracking or delamination defect within the plurality of internal layers;
    measuring an electrical parameter of the plurality of internal layers while the force is applied; and
    characterizing the plurality of internal layers based on the measuring;
    wherein the characterizing includes:
        determining an occurrence of the incipient cracking or delamination defect within the plurality of internal layers based on a change of a measured value of the electric parameter; and
        recording an amount of force applied at the occurrence of the defect.

15. The method of claim 14, wherein:
    the plurality of internal layers includes a low-k dielectric material within an interconnect structure of the unpackaged semiconductor wafer.

16. The method of claim 14, wherein the change includes a sudden variation.

17. The method of claim 14, wherein the electrical parameter is selected from the group consisting of: resistance, capacitance, leakage current, and flicker noise.

18. The method of claim 14, further including, after the characterizing, packaging the unpackaged semiconductor wafer.

19. The method of claim 14, wherein:
    the applying is carried out in a manner to induce the cracking or delamination defect within a predetermined internal layer of one of the plurality of internal layers of the unpackaged semiconductor wafer; and
    the measuring includes measuring the electrical parameter associated with the predetermined internal layer.

20. The method of claim 15, wherein the interconnect structure is an incomplete interconnect structure still undergoing fabrication, and further comprising: forming additional layers to complete the fabrication of the interconnect structure.

* * * * *